US009088226B2

(12) United States Patent
Tompkins et al.

(10) Patent No.: US 9,088,226 B2
(45) Date of Patent: Jul. 21, 2015

(54) POWER MODULE FOR CONVERTING DC TO AC

(75) Inventors: James D. Tompkins, Halifax (CA); Ryan R. Dias, Halifax (CA); Laird R. Bolt, Halifax (CA)

(73) Assignee: Electronics Motion Systems Holding Limited, Maidenhead, Berkshire (GB)

( * ) Notice: Subject to any disclaimer, the term of this patent is extended or adjusted under 35 U.S.C. 154(b) by 271 days.

(21) Appl. No.: 13/880,553

(22) PCT Filed: Oct. 19, 2011

(86) PCT No.: PCT/CA2011/001166
§ 371 (c)(1),
(2), (4) Date: Apr. 19, 2013

(87) PCT Pub. No.: WO2012/051704
PCT Pub. Date: Apr. 26, 2012

(65) Prior Publication Data
US 2013/0201741 A1    Aug. 8, 2013

Related U.S. Application Data

(60) Provisional application No. 61/482,366, filed on May 4, 2011, provisional application No. 61/394,617, filed on Oct. 19, 2010.

(51) Int. Cl.
*H02M 7/538* (2007.01)
*H02M 7/537* (2006.01)
*H02M 7/00* (2006.01)

(52) U.S. Cl.
CPC .............. *H02M 7/537* (2013.01); *H02M 7/003* (2013.01); *H02M 7/538* (2013.01)

(58) Field of Classification Search
CPC .............................. H02M 7/537; H02M 7/538
See application file for complete search history.

(56) References Cited

U.S. PATENT DOCUMENTS 3,921,201 A    11/1975    Eisele et al.
5,001,548 A    3/1991    Iversen
(Continued)

OTHER PUBLICATIONS

International Preliminary Examination Report on Patentability for International Application No. PCT/CA2011/001166 issued Apr. 23, 2013.
(Continued)

*Primary Examiner* — Evan Pert
(74) *Attorney, Agent, or Firm* — Gifford, Krass, Sprinkle, Anderson & Citkowski, P.C.

(57) ABSTRACT

A power module for converting direct current to alternating current comprising a semiconductor switching circuit device, a substrate onto which the switching circuit device is physically and electrically coupled without wirebonds, a plurality of leadframe terminals physically and electrically coupled to the substrate, and a cover including an opening exposing a bottom side of the substrate and including a wall portion oriented generally orthogonally relative to the substrate with at least some of the leadframe terminals projecting outwardly from the wall portion. The leadframe terminals projecting outwardly from the wall portion may include an affixed portion coupled to the substrate and an extending segment lying in a plane above the affixed portion with the extending segment projecting outwardly from the wall portion and the cover encapsulating the affixed portion whereby the extending segment is spaced from a plane defined by the bottom side of the substrate.

27 Claims, 10 Drawing Sheets

(56) References Cited

U.S. PATENT DOCUMENTS

| | | | |
|---|---|---|---|
| 5,079,619 | A | 1/1992 | Davidson |
| 5,323,292 | A | 6/1994 | Brzezinski |
| 5,504,378 | A | 4/1996 | Lindberg et al. |
| 5,675,473 | A | 10/1997 | McDunn et al. |
| 6,054,765 | A | 4/2000 | Eytcheson et al. |
| 6,232,151 | B1 | 5/2001 | Ozmat et al. |
| 6,442,023 | B2 | 8/2002 | Cettour-Rose et al. |
| 6,541,874 | B2 | 4/2003 | Nguyen et al. |
| 6,858,929 | B2 | 2/2005 | Zuo et al. |
| 6,865,080 | B2 | 3/2005 | Radosevich et al. |
| 7,019,395 | B2 | 3/2006 | Hirano et al. |
| 7,042,725 | B2 | 5/2006 | Martin et al. |
| 7,208,829 | B2 | 4/2007 | Hauenstein et al. |
| 7,295,433 | B2 | 11/2007 | Taylor et al. |
| 7,514,783 | B2 | 4/2009 | Shimokawa et al. |
| 7,538,425 | B2 | 5/2009 | Myers et al. |
| 7,554,188 | B2 | 6/2009 | Hauenstein |
| 7,573,727 | B2 | 8/2009 | Hauenstein et al. |
| 7,608,924 | B2 | 10/2009 | Myers et al. |
| 7,619,302 | B2 | 11/2009 | Hauenstein |
| 7,633,153 | B2 | 12/2009 | Shimokawa et al. |
| 7,723,830 | B2 | 5/2010 | Hauenstein |
| 7,759,778 | B2 * | 7/2010 | Lowry et al. .............. 257/675 |
| 7,834,448 | B2 | 11/2010 | Gerbsch |
| 7,834,575 | B2 | 11/2010 | Hauenstein |
| 7,835,151 | B2 | 11/2010 | Olesen |
| 7,956,566 | B2 | 6/2011 | Hauenstein |
| 8,018,056 | B2 | 9/2011 | Hauenstein |
| 8,120,153 | B1 * | 2/2012 | Shen .......................... 257/677 |
| 2001/0023995 | A1 | 9/2001 | Nguyen et al. |
| 2007/0138651 | A1 | 6/2007 | Hauenstein |
| 2007/0182008 | A1 | 8/2007 | Hauenstein |
| 2007/0241393 | A1 | 10/2007 | Hauenstein |
| 2007/0273009 | A1 | 11/2007 | Hauenstein |
| 2007/0290311 | A1 | 12/2007 | Hauenstein |
| 2008/0272485 | A1 | 11/2008 | Myers et al. |
| 2009/0057882 | A1 | 3/2009 | Gerbsch |
| 2009/0146293 | A1 | 6/2009 | Olesen |
| 2009/0184760 | A1 | 7/2009 | Hauenstein |
| 2009/0243764 | A1 | 10/2009 | Hauenstein |
| 2009/0279220 | A1 | 11/2009 | Hauenstein et al. |

OTHER PUBLICATIONS

Written Opinion of the International Searching Authority for International Application No. PCT/CA2011/001166 completed Feb. 9, 2012.

\* cited by examiner

POWER MODULE FOR CONVERTING DC TO AC

BACKGROUND OF THE INVENTION

The invention relates to a power module for converting high voltage direct current (DC) to high voltage alternating current (AC), such as, but not necessarily limited to, power modules used in hybrid vehicles and purely electric vehicles.

In the past, power modules for hybrid or electric automobiles have often provided cooling on a single side of an electronic device, such as a power MOSFET (metal oxide semiconductor field effect transistor), IGBT (insulated gate bipolar transistor), or other component. Due to the placement of such power modules on heat sinks, lead frame terminals of such devices may come in close proximity to the heat sinks. Further, past power modules typically have used wirebonds to one or more sides of the power module device. The use of wirebonds creates problems with high assembly time and capital equipment costs, as well as high parasitic inductances that cause voltage overshoots. Still further, wirebonds can lead to failures due to repetitive power cycling.

SUMMARY OF THE INVENTION

The present invention provides an improved power module that provides leadframes protruding from a cover member that are elevated relative to a substrate of the power module to which they are connected thereby promoting electrical isolation relative to a heat sink to which the power module may be affixed, eliminates wirebond connections and, in at least some embodiments, allows double sided cooling. These and/or other features of the design reduce the overall manufacturing costs, reduce parasitic inductances, and improve mean time between failures.

According to one embodiment, a power module for converting direct current to alternating current comprises a semiconductor switching circuit device, a substrate onto which the switching circuit device is physically and electrically coupled without wirebonds, a plurality of leadframe terminals physically and electrically coupled to the substrate, and a cover. The cover includes an opening exposing a bottom side of the substrate and includes a wall portion oriented generally orthogonally relative to the substrate with at least some of the leadframe terminals projecting outwardly from the wall portion. The leadframe terminals projecting outwardly from the wall portion include an affixed portion coupled to the substrate and an extending segment lying in a plane above the affixed portion with the extending segment projecting outwardly from the wall portion and the cover encapsulating the affixed portion whereby the extending segment is spaced from a plane defined by the bottom side of the substrate.

In particular embodiments, the leadframe terminals projecting outwardly from the wall portion further include a vertical segment positioned between the affixed portion and the extending segment with the vertical segment positioning the extending segment in a plane above the affixed portion. The affixed portions may be connected to the vertical segments by a first bend in the leadframe terminals, such as a bend forming an approximately right angle. Correspondingly, the extending segments may be connected to the vertical segments by a second bend in the leadframe terminals, with such bends also forming an approximately right angle. Also in particular embodiments, the extending segments project generally horizontally from the wall portion relative to the plane defined by the bottom side of the substrate.

According to other aspects of the invention, the power module further comprises at least one secondary substrate with the switching circuit device being physically and electrically coupled to the secondary substrate such that the switching circuit device is formed between the substrate and the secondary substrate. The power module may include a single secondary substrate disposed over both a high side switching circuit device and a low side switching circuit device, or may include a pair of secondary substrates, with one of the secondary substrates being physically and electrically coupled to a high side switching circuit device and the other secondary substrate being physically and electrically coupled to a corresponding low side switching circuit device. The switching circuit device is coupled to the substrate and the secondary substrate by a soldered or a sintered connection.

In particular embodiments the cover is at least partially disposed over a top side of the power module and includes at least one cover aperture exposing a top side of the secondary substrate, and may include a pair of cover apertures with one aperture exposing a top side of a secondary substrate of a high side switching circuit device and the other apertures exposing a top side of a secondary substrate of a low side switching circuit. The leadframe terminals projecting outwardly from the wall portion may include at least one of a battery terminal and a phase terminal. Alternatively and or additionally, other leadframe terminals projecting outwardly from the wall portion may further include an upright portion extending generally vertically upwards from the extending portions. The cover may be molded and may include a peripheral raised portion forming the wall portion, with the affixed portions and part of the extending portions of the leadframe terminals being encapsulated within the raised portion. The cover may include the peripheral raised portion and wall portion on at least two sides or ends. The cover may further include a recessed portion extending at least partially over to cover or form a top side of the power module, with the recessed portion being surrounded by the peripheral raised portion. One or more apertures may be formed in the recessed portion to enable cooling access to one or more secondary substrates.

According to still other aspects of the invention the switching circuit device includes a plurality of insulated gate bipolar transistors and diodes. The substrate and/or secondary substrate may include a ceramic layer having a top side and a bottom side, a first copper layer coupled to said top side of said ceramic layer, and a second copper layer coupled to said bottom side of said ceramic layer. Alternatively, the substrate and/or secondary substrate may include a copper layer, an aluminum oxide layer, and an aluminum plate, with said aluminum oxide layer being formed on said aluminum base plate and said copper layer being applied over said aluminum oxide layer.

According to another embodiment of the invention, a power module for converting direct current to alternating current comprises a semiconductor switching circuit device, and an underlying substrate and at least one secondary substrate, with the switching circuit device being physically and electrically coupled without wirebonds to the underlying substrate and the secondary substrate such that the switching circuit device is formed between the underlying substrate and secondary substrate whereby the switching circuit device comprises at least one high side switching circuit device and at least one low side switching circuit device. The power module further comprises a plurality of leadframe terminals physically and electrically coupled to the underlying substrate and a cover at least partially disposed about a top side of the power module. The cover includes an opening exposing a bottom side of the substrate and includes an upstanding wall portion at least partially disposed about the opening with at least some of the leadframe terminals projecting outwardly from the wall portion and including a vertical segment encapsulated within the cover and an extending segment projecting outwardly from the wall portion. The vertical segment is connected to the extending segment and elevates the extending segment above the substrate whereby the portion of the extending segment projecting outwardly from the wall portion is vertically elevated from the connection of the leadframe terminals with the substrate.

In particular embodiments the power module comprises a single secondary substrate disposed over both the high and low side switching circuit devices, or comprises at least one pair of secondary substrates, with one secondary substrate disposed over the high side switching circuit device and the other of the pair of secondary substrates disposed over the low side switching circuit device. The switching circuit device is preferably coupled to the underlying substrate and the secondary substrate by a sintered connection.

According to other aspects of the invention the cover includes at least one aperture exposing a top side of the secondary substrate. The leadframe terminals projecting outwardly from the wall portion may include at least one of a battery terminal and a phase terminal. Alternatively and/or additionally, leadframe terminals projecting outwardly from the wall portion may further include an upright portion extending generally vertically upwards from the extending portions.

In still other aspects of the invention, pairs of high side switching circuit devices and low side switching circuit devices are arranged in parallel with each pair of high and low side switching circuit devices comprising an IGBT and a diode, with the respective IGBTs of each pair being arranged in series and the respective diodes of each pair being arranged in series. Still further, the underlying substrate and/or the secondary substrate may include a ceramic layer having a top side and a bottom side, a first copper layer coupled to the top side of the ceramic layer, and a second copper layer coupled to the bottom side of the ceramic layer. Alternatively, the underlying substrate and/or the secondary substrate may include a copper layer, an aluminum oxide layer, and an aluminum plate, with the aluminum oxide layer being formed on the aluminum base plate and the copper layer being applied over the aluminum oxide layer.

A power module for converting direct current to alternating current includes a semiconductor switching circuit device, a substrate, and may be employed with a cooling unit. The switching device includes a plurality of terminals, and may include one or more MOSFETs, IGBTs, or other suitable switching components, including die-up or flip-die IGBTs. The cooling unit may be physically coupled to the switching circuit device and the substrate by way of a pressure fit, with the cooling unit including a first portion and a second portion spaced away from the first portion wherein the first and second portions are adapted to sandwich the substrate and switching circuit device therebetween. The first and second portions of the cooling unit may include hollow cavities adapted to allow a cooling liquid to flow therethrough. The module may include a battery positive terminal, a battery negative terminal and a phase leadframe terminal, with the battery terminals being on an adjacent end or edge or on opposite ends or edges of the module with respect to each other. The phase terminal may be coupled to the substrate at an end or edge opposite the battery terminals or adjacent to one or more of the battery terminals. The switching circuit device may include a plurality of insulated gate bipolar transistors and diodes. The module may be constructed such that no separate fasteners are used to couple the cooling unit to the substrate and switching circuit device. The first portion of the cooling unit may make contact with a top side of the switching circuit device at a location aligned with a switching circuit inside the switching circuit device, and the second portion of the cooling unit may make contact with a bottom side of the substrate that is aligned with the first portion.

In other embodiments, a cover may be provided that fits over at least a top side of the substrate and that includes at least one opening for the cooling unit. The cover may be attached to the substrate by way of an electrical potting compound. The cover may include at least one aperture adapted to receive the electrical potting compound. The potting compound may also spread over a plurality of leadframe terminals attached to the substrate, and the cover may include retaining means positioned around a periphery of the cover adapted to prevent the potting compound from flowing past outer edges of the substrate.

These and other objects, advantages, purposes and features of this invention will become apparent upon review of the following specification in conjunction with the drawings.

DETAILED DESCRIPTION OF THE EMBODIMENTS

Figure 1:
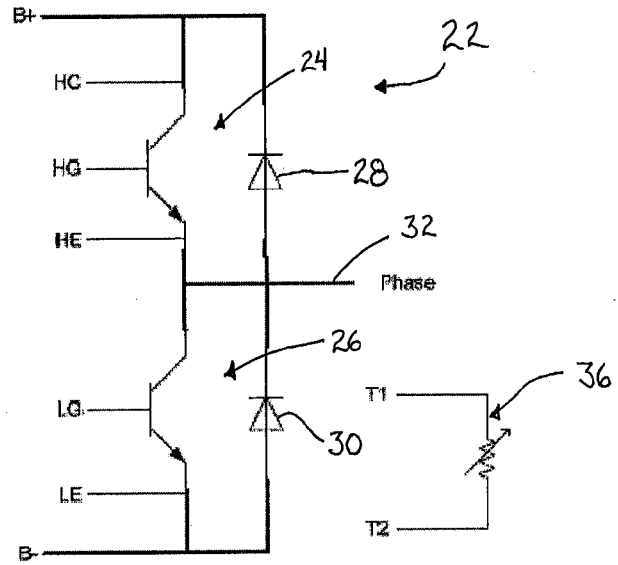
FIG. 1 is an electrical schematic of the circuit that may be incorporated into a signal power module according to a first embodiment.
Figure 2:
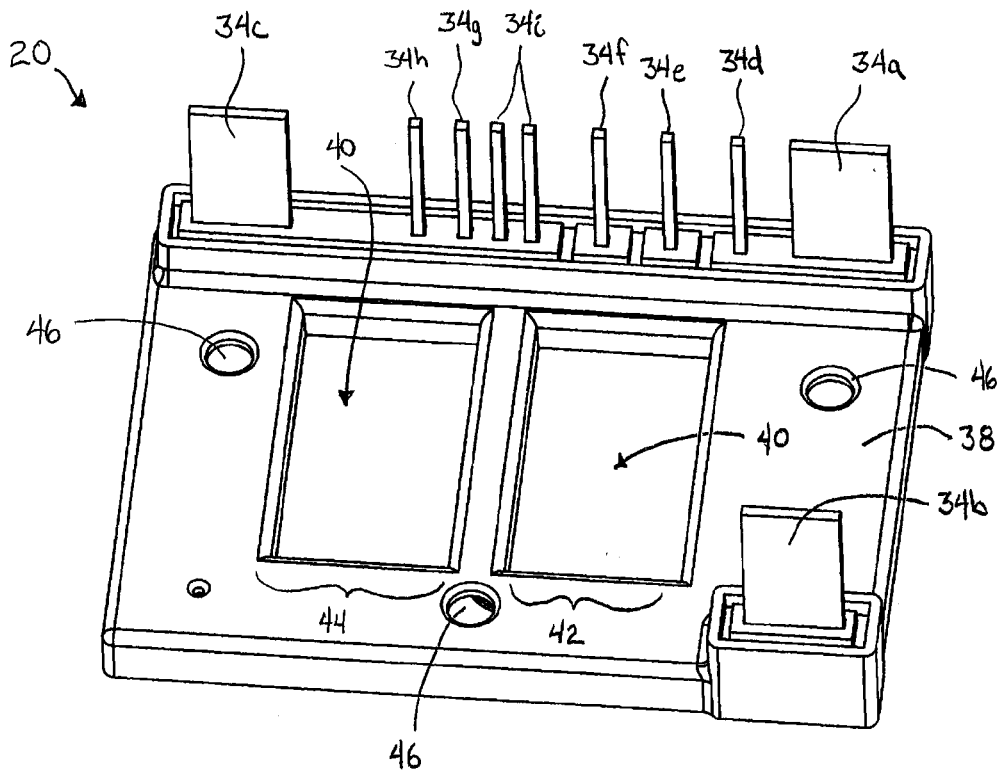
FIG. 2 is a perspective view of the power module of the first embodiment shown with a cover attached.
Figure 2A:
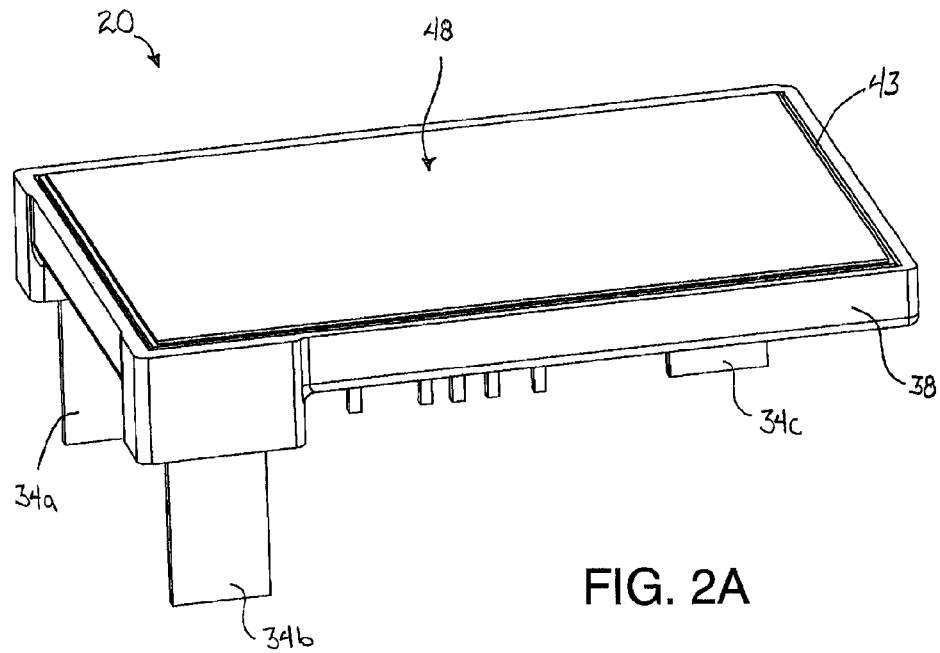
FIG. 2A is a bottom perspective view of the power module of FIG. 2.

A power module 20 according to one embodiment of the present invention is shown in FIG. 2. Power module 20 implements a switching circuit 22 that is shown in FIG. 1, which may be useful in a variety of different applications. Such applications may include the conversion of DC electricity to AC electricity inside of either a purely electric vehicle, or a hybrid vehicle that partially runs on electricity and partially runs on fossil fuels, such as gasoline or diesel fuel. Lead B+ is intended to be connected to the positive terminal of a battery, or a set of batteries. Lead B− is intended to be connected to the negative terminal of a battery, or a set of batteries. The terminal labeled "Phase" is intended to output an alternative current signal that may be used in powering an AC motor inside a vehicle, or which may be used to power other components of a vehicle, as well as in non-vehicle applications.

In many instances it may be desirable to have one or more batteries supply three-phase alternating current. In such situations, three power modules 20 may be used with each power module 20 supplying one of the three alternating phases at its "phase" output. A controller (not shown) will control the three phases such that they are 120 degrees out of phase with each other, or in any other desired manner to create the desired phase relationship. Such control is afforded by controlling the voltage supplied to the two switches in the switching circuit 22, as will be described more below.

Switching circuit 22, as illustrated, includes a first insulated gate bipolar transistor (IGBT) 24, a second IGBT 26, a first diode 28, and a second diode 30, with first IGBT 24 and first diode 28 forming a high side and second IGBT 26 and second diode 30 forming a low side of the switching circuit 22. The two IGBTs 24 and 26 are arranged in series with respect to each other. The two diodes 28 and 30 are also arranged in series with respect to each other. The sets of diodes and IGBTs are arranged in parallel with respect to each other. A phase terminal 32 is positioned between the first IGBT and diode and the second IGBT and diode.

As shown in FIG. 1, first IGBT 24 includes a collector HC, a gate HG, and an emitter HE. Second IGBT 26 includes a gate LG and an emitter LE. As would be known to one skilled in the art, by appropriately applying voltage to the two gates HG and LG, alternating current can be generated at phase terminal 32.

A thermistor 36 is also included as part of switching circuit 22 in order to monitor the temperature of the circuit to ensure that the temperature does not exceed a maximum safe operating temperature. Thermistor 36 may be positioned at a location within the vicinity of the other electrical components of switching circuit 22 where its temperature will reflect the temperature of switching circuit 22.

FIG. 2 includes a plurality of leadframe terminals 34. These leadframes include power leads associated with the positive battery terminal 34a, the negative battery terminal 34b, and phase terminal 34c, which correspond to the B+, B− and phase terminals of the circuit 22 of FIG. 1, respectively. Signal leadframes include 34d corresponding to collector HC of circuit 22, 34e corresponding to gate HG of circuit 22, 34f corresponding to emitter HE of circuit 22, 34g corresponding to gate LG of circuit 22, and 34h corresponding to emitter LE of circuit 22. Also included are thermistor leads 34i corresponding to the thermistor 36 of FIG. 1

Leadframes 34 may be joined to a substrate 48 discussed below, in various manners. While conventional soldering may be employed, in particular embodiments leadframes 34 may be connected to substrate 48 by welding, such as laser welding or ultrasonic welding, or by sintering. Due to the high cyclic temperatures undergone by power module 20 between use and non-use, such alternative techniques relative to soldering may be used to promote reliability between the connection of leadframes 34 to power module 20.

Figure 2B:
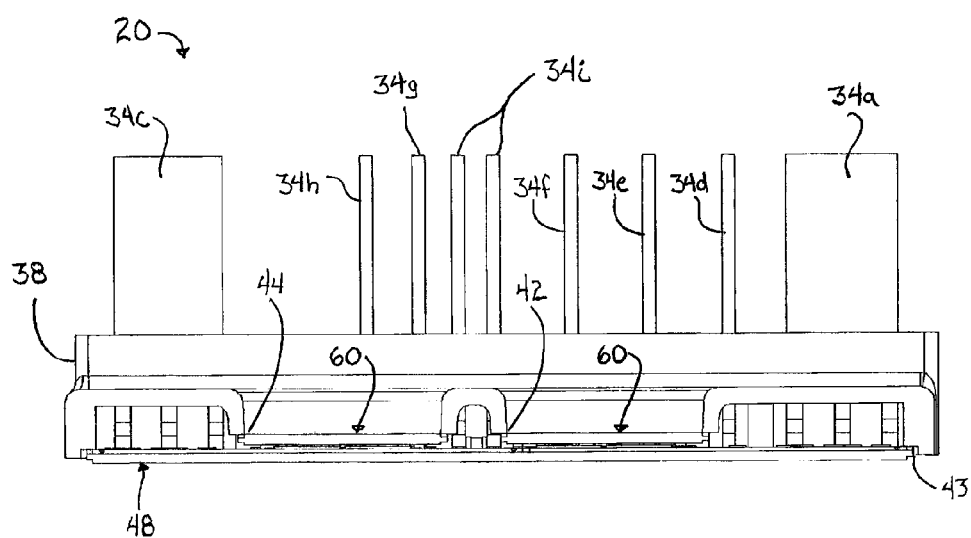
FIG. 2B is a sectional view of the power module of FIG. 2.

Module 20 shown in FIG. 2 includes a plastic cover 38 that covers most of a substrate and other components on which a pair of switching circuit devices 40 are mounted. Cover 38 includes a first aperture 42 and a second aperture 44. First and second apertures 42 and 44 provide clearance for a cooling unit (shown in FIGS. 7-8) to be positioned in contact with a first side of switching circuit devices 40, as will be discussed in greater detail below. Cover 38 further includes a plurality of holes or apertures 46 that are adapted to receive electrical potting compound to thereby help secure cover 38 to an underlying substrate 48 (FIGS. 3-6). As shown in FIG. 2B, cover 38 provides an opening 43 at the underside of module 20 such that the bottom surface of substrate 48 is exposed whereby power module may be in contact with a cooling unit, discussed below. Cover 38 thus includes and provides covering about the edges and a portion of the top surface of module 20, including between switching circuit devices 40.

Each switching circuit device 40 includes one IGBT and one diode. Each switching circuit device may be a commercially available switching circuit marketed by companies such as International Rectifier of El Segundo, Calif. A first one of switching devices 40 thus provides first IGBT 24 and first diode 28, while a second one of switching devices 40 provides second IGBT 26 and second diode 30. By utilizing two switching devices 40, switching circuit 22 is incorporated into module 20.

Each switching device 40 may be constructed such that it includes a first terminal on one side and two other terminals on the other side. In the embodiment illustrated, a top side of each switching device includes terminals for both the emitter and gate of each IGBT, while a bottom side corresponds to the collector of each IGBT. Appropriate connections to these terminals are made via solder or sinter connections with substrate 48, as discussed more below.

Substrate 48 is divided into several electrically isolated sections by one or more grooves or troughs 50 defined in substrate 48, with grooves 50 being etched in a layer of substrate 48, such as a copper layer. These sections include a first section 52, a second section 54, and a third section 56, as well as any other necessary sections. In the embodiment shown, section 52 is in electrical communication with the emitter (LE) of second IGBT 26 via a plurality of solder bumps 58 that are reflowed during the manufacturing process to electrically couple a secondary substrate 60 (FIG. 5) to first section 52 of substrate 48. Second section 54 is in electrical communication with phase terminal 32. Third section 56 is in electrical communication with the collector (HC) of first IGBT 24.

Figure 4:
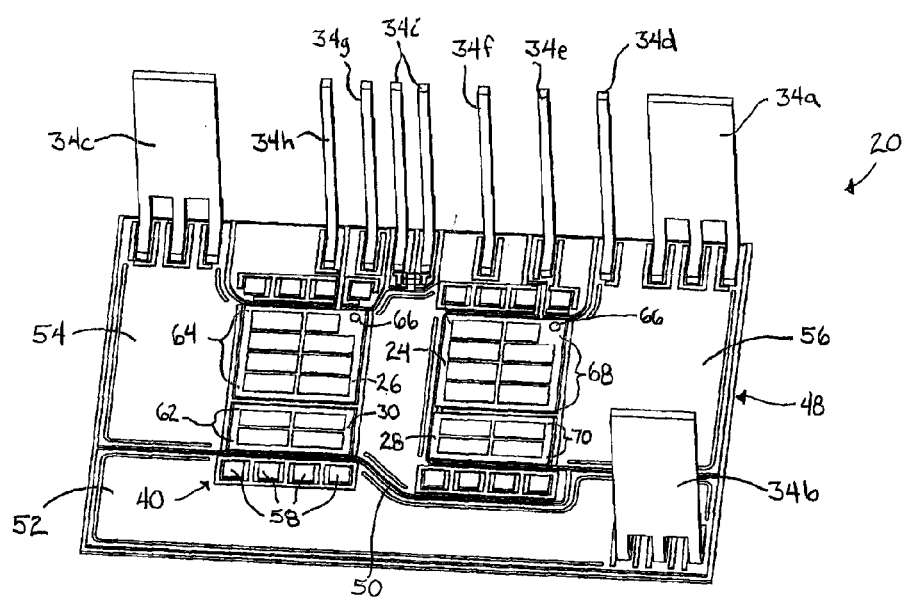
FIG. 4 is a perspective view of the power module of FIG. 3 shown with a portion of the semiconducting switching circuits removed.

The electrical connections between the various sections of substrate 48 and the switching circuit devices 40 is accomplished by a plurality of solder bumps that are visible in FIG. 4. In addition to solder bumps 58 discussed above, module 20 includes solder bumps 62 that electrically and physically couple the phase terminal 32 side of second diode 30 to second section 54. Module 20 further includes solder bumps 64 that electrically and physically couple the phase terminal 32 side of second IGBT 26 to section 54. Solder bumps 66 connect the gates of each IGBT to a portion of secondary substrate 60 that is electrically isolated from the portion of substrate 60 in electrical communication with the IGBT's emitters. Solder bumps 68 and 70 connect the collector side of first diode 28 and first IGBT 24 to third section 54 of substrate 48. Solder bumps 71 physically and electrically couple the corresponding secondary substrates 60 to the respective leadframe terminals 34 that are in electrical communication therewith.

Figure 5:
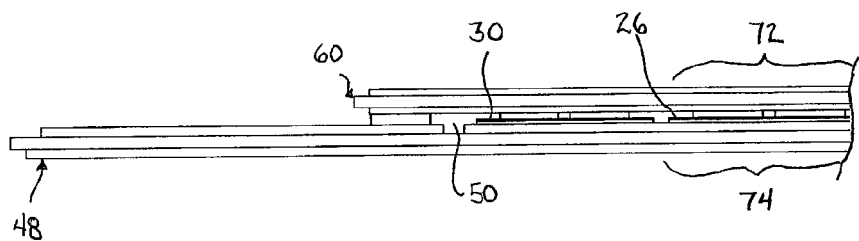
FIG. 5 is a partial, sectional view of the power module of FIG. 3 taken along the plane labeled V-V in FIG. 3 when viewed from the direction of the arrows attached to this plane.
Figure 6:
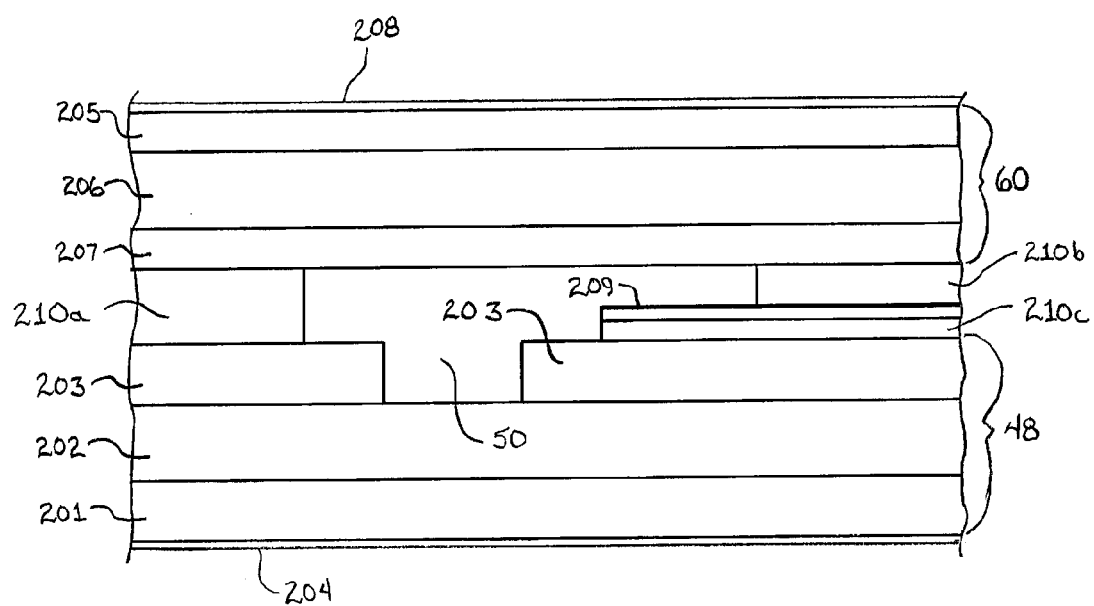
FIG. 6 is a close up view of exemplary layers illustrated in FIG. 5.

FIGS. 5 and 6 illustrate the layered construction of substrate 48, switching circuit devices 40 (including their associated secondary substrate 60), and the various solder connections. With reference to FIG. 6, substrate 48 includes an outer copper layer 201, a central ceramic layer 202, and an inner discontinuous copper layer 203, with substrate 48 thus comprising a direct bonded copper ("DBC") substrate. Correspondingly, substrate 60 includes an outer copper layer 205, a central ceramic layer 206, and an inner copper layer 207 such that substrate 60 also comprises a DBC substrate. Between substrates 48 and 60 is positioned a power silicon member 209, such as either an IGBT or diode, with various solder connections 210*a*, 210*b*, 210*c*, such as formed from the above discussed solder bumps, between substrates 48 and 60 and member 209. A thermal interface material 204 and 208 may be applied to the outer copper layers 201 and 205, respectively.

Solder connections 210 may alternatively be sintered connections. The use of sintered connections, such as silver based sintering, provides higher melt temperatures relative to soldered connections. Sintering, thus, provides a greater delta difference relative to the operating temperatures of the switching devices 40 and, in turn, may increase reliability in view of the cyclic temperature cycling of power module 20 in operation. Still further, formation of sintered connections 210 via a sintering process employing the application of both temperature and pressure may be used to promote flatness of switching devices 40. For example, the relative co-planarity between substrates 60 of the two switching circuit devices 40 of power module 20 may be promoted, which in turn may promote cooling by enhancing the interface of substrates 60 with a cooling unit, such as discussed below. Such sintered connections may be employed to connect the power devices to either one or both of substrates 48 and 60.

The top side of secondary substrate 60 includes a power device surface area section 72 shown in FIG. 5. This surface area 72 is aligned with and corresponds to the area of the IGBT inside device 40. This surface area 72 will therefore most likely experience the greatest amount of heat generation along secondary substrate 60 due to the corresponding IGBT. Thus, this area 72 for each device 40 is intended to be aligned with one of the apertures 42, 44 in cover 38. Similarly, an underside of substrate 48 includes a power device surface area 74 that is also aligned with and corresponds to the area of the IGBT insides device 40. Power device surface area 74 will also most likely experience the greatest amount of heat generation of all of substrate 48 due to its proximity to the IGBT. Surface areas 72 and 74 therefore may be in direct physical contact with opposing portions of a cooling unit 78, via being exposed via apertures 42, 44 and bottom opening in cover 38, as will be discussed more below with respect to FIGS. 7-9.

Figure 7:
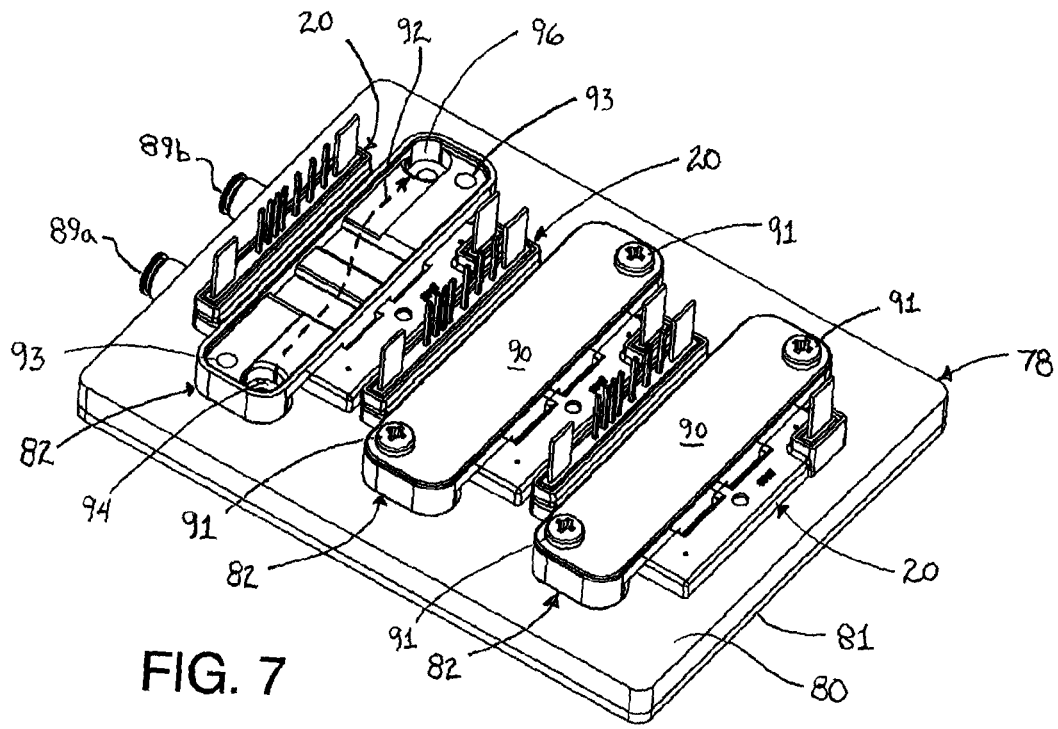
FIG. 7 is a perspective view of modules of FIG. 1 shown attached to a cooling unit with a plate of a portion of the cooling unit removed in order to illustrate a cooling flow channel.

A module set 86 is shown in FIG. 7. Module set 86 includes a plurality of power modules 20 and one cooling unit 78. The number of modules 20 that may be incorporated into a single cooling unit 78 can vary. However, in one embodiment, three modules 20 may be included such that each module 20 may be used to generate one phase of a three phase AC supply.

Cooling unit 78 may be a liquid cooling unit that provides cooling to both sides of the diodes and IGBTs within each switching circuit device 40. Cooling unit 78 includes a first main portion 80, disclosed as a plate portion, and one or more second portions 82, disclosed as clamp portions Three second portions 82 are shown in FIG. 7 to provide cooling and physical support for three modules 20. Each second portion 82 is configured to physically secure a respective module 20 to cooling unit 78 without the use of any separate fasteners. That is, two projections on an underside of each second portion 82 press against all or a portion of power device area 72 on top of each switching circuit device 40 by projecting into apertures 42, 44, while a top side of first portion 80 is shaped to press against all or a portion of power device area 74. It will be understood, of course, that cooling unit 78 may advantageously press against more surface area than that defined by areas 72 and 74 in order to provide better heat dissipation. However, in at least one embodiment, cooling unit 78 provides direct contact with at least these areas because they are closest to the largest heat sources (the IGBTs).

The configuration of cooling unit 78 thereby sandwiches each module 20 between first portion 80 and a respective second portion 82. This friction fit enables each power module 20 to be physically secured to cooling unit 78 without the need for any separate fasteners, such as screws, bolts, rivets, pins, or the like, that pierce any portion of module 20.

Figure 8:
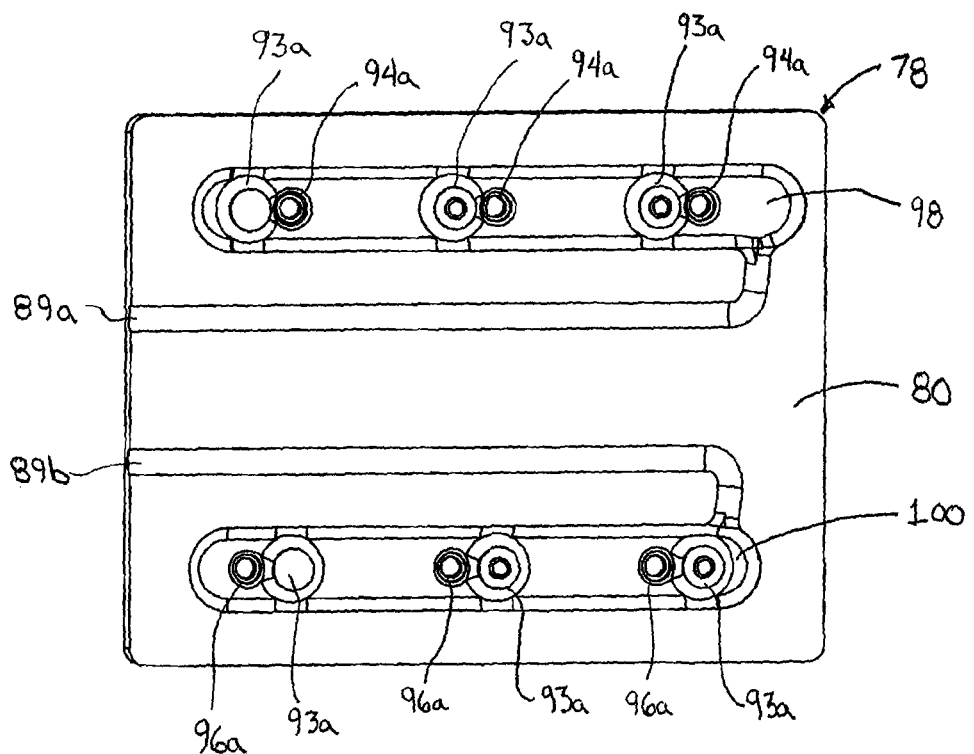
FIG. 8 is a perspective view of the underside of the cooling unit of FIG. 7.
Figure 9:
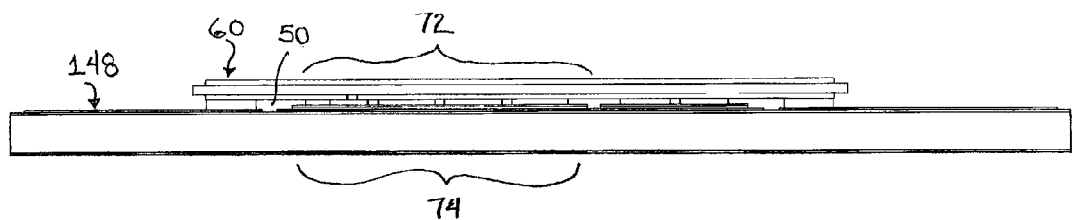
FIG. 9 is a partial, sectional view of an alternative power module in accordance with the present invention similar to FIG. 5 above.
Figure 10:
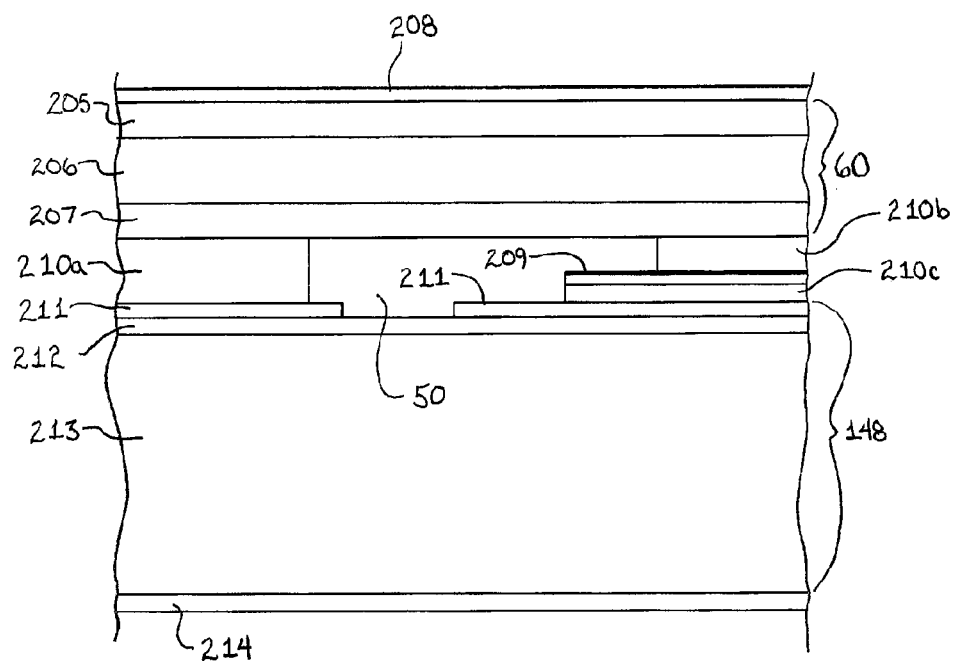
FIG. 10 is a partial close up view of the layers illustrated in FIG. 9.
Figure 11:
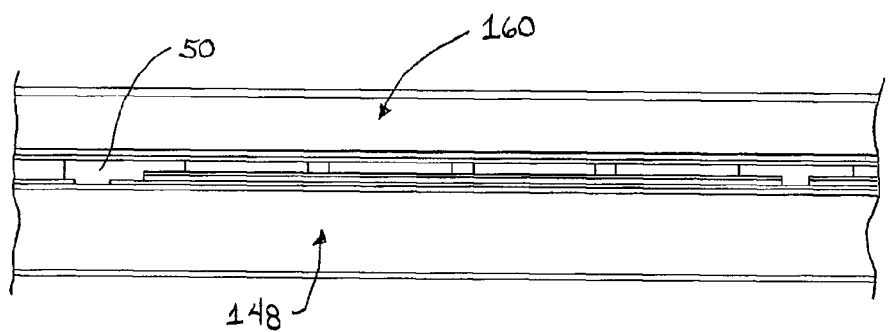
FIG. 11 is a partial, sectional view of another alternative power module in accordance with the present invention as viewed in similar to FIG. 5 above.
Figure 12:
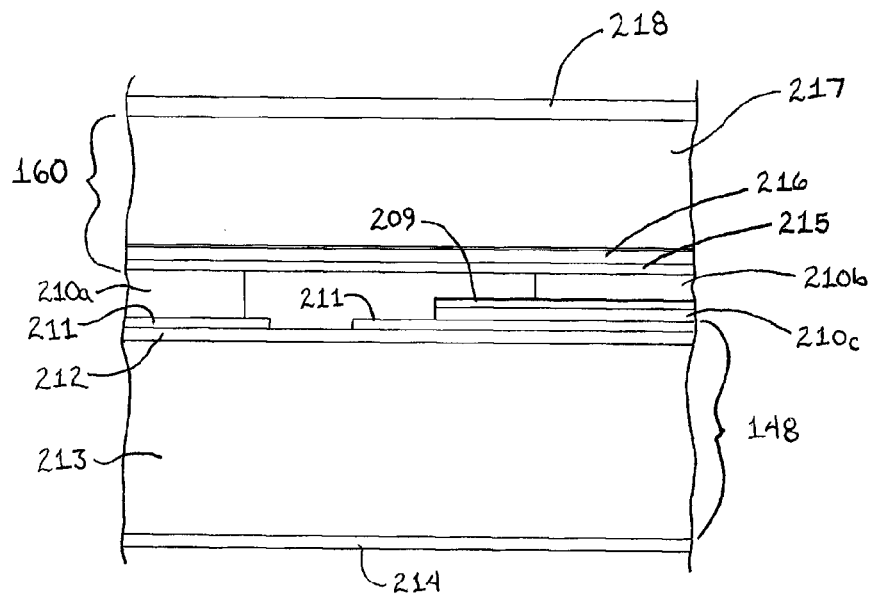
FIG. 12 is a partial close up view of the layers illustrated in FIG. 11.

FIGS. 7 and 8 illustrate exemplary fluid flow paths within cooling unit 78. More specifically, FIG. 7 shows cooling unit 78 with a top plate 90 removed from one of second portions 82. The removal of top plate 90 reveals a fluid path 92 that extends from a first hole 94 to a second hole 96. Each hole 94 and 96 is in fluid communication with a respective hole defined in first portion 80 of cooling unit 78. This can be seen in FIG. 8, which shows the underside of first portion 80. Hole 94*a* is aligned with hole 94 to thereby allow fluid to flow from a channel 98 defined in first portion 90 through holes 94 and 94*a* into fluid path 92. Similarly, hole 96*a* is aligned with hole 96 to thereby allow fluid to flow out of fluid path 92 via holes 96 and 96*a* into a second channel 100 defined in first portion 90. The flow of the fluid, which may be any convention cooling liquid or other fluid, may be in a reverse direction.

Cooling unit 78 includes two fluid ports 89*a*, 89*b* that may fluidly couple unit 78 to a fluid cooling device, or any other suitable device. A bottom plate 81 (FIG. 7), or other structure, may be attached to the underside of first portion 80 of unit 78 to thereby enclose channels 98 and 100 in all regions except the fluid ports and holes 94*a* and 96*a*. As can also be seen in FIG. 8, additional holes 94*a* and 96*a* may be provided in order to provide fluid circulation to the second and third second portions 82 of unit 78 that secure and cool the second and third modules 20 of module set 86. Second portions 82 are secured to first portion 80 by way of fasteners 91 passing through holes 93 in second portions 82 and received in nuts 93*a* of first portion 80. Seals, such as o-rings, may be disposed between second portions 82 and first portion 80 to provide further fluid sealing. Such seals may further enable portions 82 to securely mate with switching devices 40 by accommodating for manufacturing deviations in flatness.

With reference to FIGS. 9-12, alternatively configured power modules are illustrated incorporating one or more alternative substrates relative to or in place of substrate 48 and/or secondary substrate 60 discussed above. In the illustrated embodiment of FIGS. 9 and 10, substrate 148 is shown in place of substrate 48 relative to the embodiment shown in FIGS. 5 and 6, and in the embodiment of FIGS. 11 and 12, substrate 148 and secondary substrate 160 are shown in place of substrate 48 and secondary substrate 60, respectively, relative to the embodiment of FIGS. 5 and 6.

Substrate 148 and secondary substrate 160 are referred to as advanced metal substrates (AMS), such as supplied by Micro Components Ltd. of Migdal Ha'emek, Israel, and may be employed in place of direct bond copper substrates as shown. As detailed in FIGS. 9-12, substrate 148 and secondary substrate 160 consist of a copper layer 211,215, an aluminum oxide ($Al_2O_3$) dielectric layer 212, 216, and an aluminum base plate 213, 217. The AMS substrates are produced by growing the aluminum oxide on the aluminum base plate, then initially sputtering on the copper layer and subsequently platting on additional copper to obtain a desired thickness. In the illustrated embodiments of substrate 148 and secondary substrate 160, the aluminum base plate has a thickness of approximately 1.5 to 1.6 millimeters (mm) and the copper layer has a thickness of up to approximately 80 microns (um). The aluminum oxide dielectric layer may provide an insulation rating of 25 V/um or better. Thus, the aluminum oxide layer of substrate 140 and secondary substrate 160 may have a thickness of approximately 100 microns or less to obtain a 2500V isolation.

In other regards the power modules of FIGS. 9-12 are substantially similar as discussed above with reference to FIGS. 1-8, including the various interconnections and functions. For example, substrate 148 is divided into several electrically isolated sections by one or more grooves 50 defined in substrate 148, such as in like manner to first section 52, second section 54, and third section 56, as well as any other necessary sections, of substrate 48. As such, a first section may be in electrical communication with the emitter (LE) of second IGBT 26 via a plurality of solder bumps 58 that are reflowed during the manufacturing process to electrically couple secondary substrate 160 to first section 52 of substrate 148. A second section would be in electrical communication with phase terminal 32 and a third section would be in electrical communication with the collector (HC) of first IGBT 24. The electrical connections between the various sections of substrate 148 and the switching circuit devices 40 being accomplished by a plurality of solder bumps, in like manner to the solder bumps illustrated in FIG. 4.

Still further, the top side of secondary substrate 160 includes a power device surface area, in like manner to surface area 72 of secondary substrate 60 shown in FIG. 5, and an underside of substrate 148 includes a power device surface area, in like manner to surface area 74 of substrate 48 shown in FIG. 5. The power device surface areas of substrate 148 and secondary substrate 160 corresponds to the area of the IGBT inside the switching circuit, with the power device surface areas of substrate 148 and secondary substrate 160 therefore being in direct physical contact with opposing portions of a cooling unit, such as cooling unit 78.

Referring now to FIG. 13, an alternative power module 120 in accordance with the present invention is illustrated, where module 120 is similar to module 20 discussed above, with like elements being shown in FIG. 13 with 100 added to the corresponding reference numerals of FIGS. 1-4. Due to the similarities, not all of the corresponding features or aspects of power module 120 are discussed herein.

Figure 13:
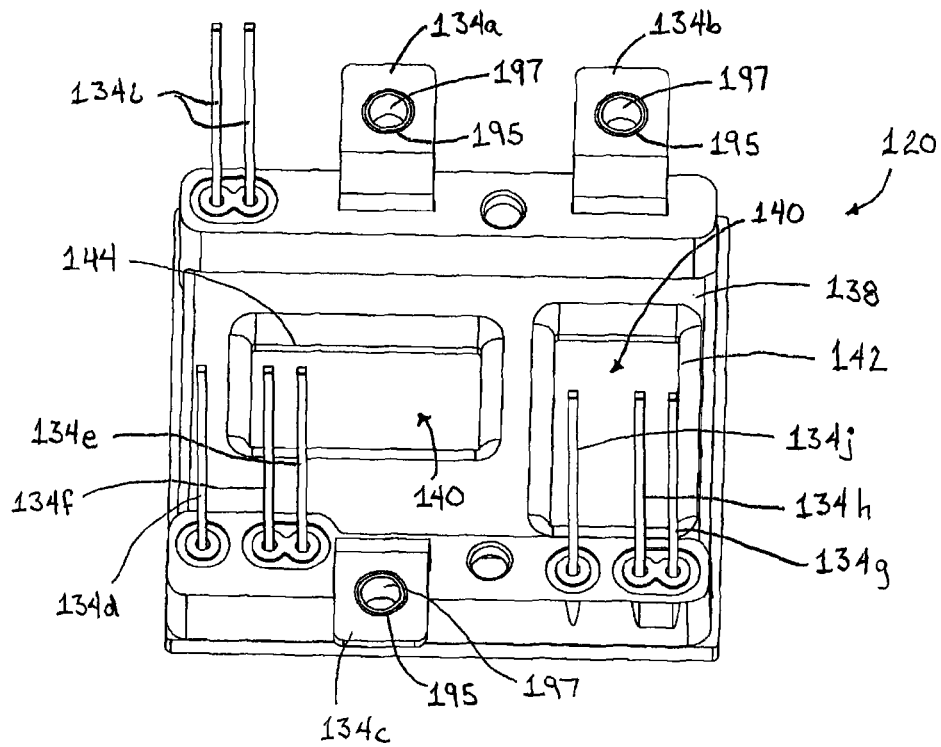
FIG. 13 is a perspective view of an alternative embodiment of a power module in accordance with the present invention.

Power module 120 includes a cover 138 having apertures 142 and 144 exposing a top portion of switching circuit devices 140, with switching circuit devices 140 being oriented at 90 degrees relative to one another. The orientation of switching circuit devices 140 in this manner operates to minimize routing distances of the various power connections of the circuit 22, such as the battery to collector and emitter to phase connections. This in turn promotes a reduction in the inductance and resistance of power module 20. It should be appreciated that the switching circuit devices of the various power module embodiments disclosed herein may alternatively be oriented in like fashion as shown with module 120. In the embodiment of FIG. 13, each of switching circuit devices 140 includes a flip-die IGBT in which the collector side is oriented downward and the emitter and gate sides are oriented upwards. That is, the collector side is affixed to an underlying substrate, such as a substrate 48, and the opposite emitter and gate sides are affixed to a secondary substrate, such as a substrate 60.

As further shown in FIG. 13, battery power terminals 134a and 134b are located on one side, edge or end of module 120, with phase terminal 134c being located on the opposite side, edge or end. Terminals 134a, 134b and 134c each include holes 195 with captive nuts 197 secured to the underside of the terminals 134a, 134b, 134c, with the holes 195 and nuts 197 being used to enable screw connection thereto. Thermistor pins 134j are located on the same side as battery power terminals 134a and 134b. The gate drive pins—the high side gate 134e, emitter 134f, and collector 134d and the low side gate 134g, emitter 134h and a low side collector 134j—are located on the opposite side.

FIG. 13 further illustrates the various terminals as projecting from the top surface of module 120 through cover 138, with the battery power terminals 134a, 134b and phase terminal 134c being bent to project outwardly to the sides of module 120. As with module 20 above, power module 120 may be affixed to a cooling unit 78, in addition a gate driver board (not shown) is disposed over module 20, with the upstanding leadframe pins 134d-134 projecting into the gate driver board.

Referring now to FIGS. 14A-14C, an alternative power module 220 in accordance with the present invention is illustrated, where module 220 is similar to module 20 and 120 discussed above, with like elements being shown in FIGS. 14A-14C with 100 added to the corresponding reference numerals. Due to the similarities, not all of the corresponding features or aspects of power module 220 are discussed herein.

Figure 14A:
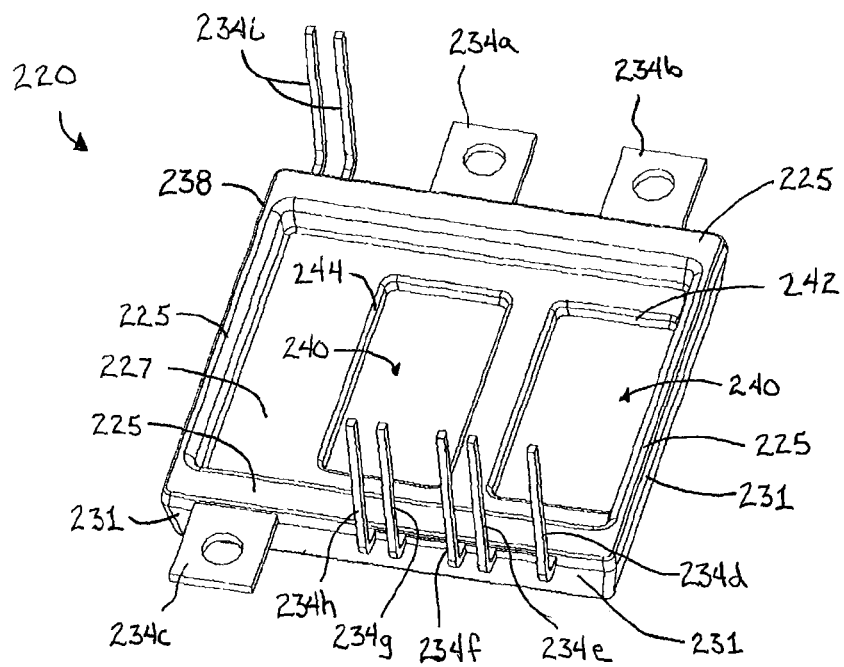
FIG. 14A is a perspective view of another embodiment of a power module in accordance with the present invention.
Figure 14B:
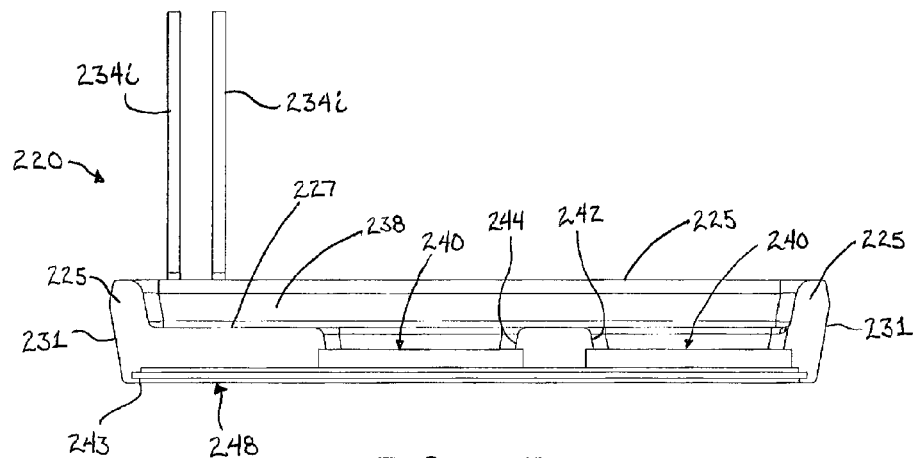
FIG. 14B is a sectional view of the power module of FIG. 14A.
Figure 14C:
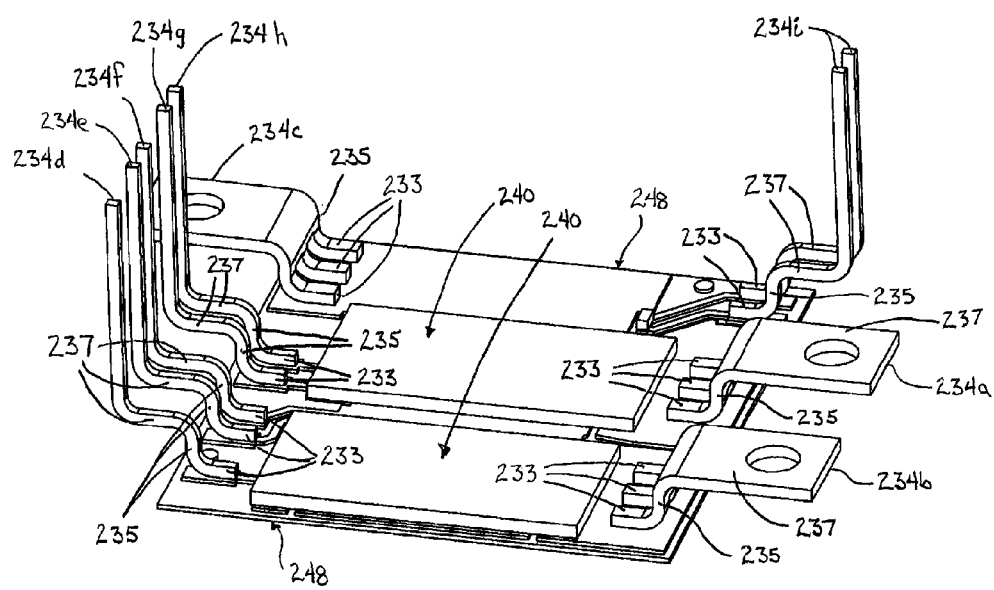
FIG. 14C is a perspective view of the power module of FIG. 14A shown with the molded cover removed disclosing the connection of the leadframes.

Power module 220 includes a cover 238 having apertures 242 and 244 exposing a top portion of switching circuit devices 240. Cover 238 comprises a plastic material that is formed or molded about power module 220, such as by way of a transfer molding operation. As shown, cover 238 includes a raised portion or edge 225 extending about the periphery of module 220. An inner recessed portion 227 covers a portion of the top surface of power module 220, with portion 227 being surrounded by edge 225 in the illustrated embodiment and with apertures 242 and 244 being formed in portion 227. Raised portion 225 further defines an upstanding wall portion 231 surrounding module 220, with wall portion 231 being generally vertically oriented in the illustrated embodiment. As understood from FIG. 14B, cover 238 further includes a bottom opening 243 exposing substrate 248 for contact with a heat sink. In the embodiment of FIGS. 14A-14C, one of the switching circuit devices 240 includes a flip-die IGBT, as discussed above with regard to FIG. 13, with the other switching circuit device 240 including a die-up IGBT, that is, with the emitter and gate sides oriented downward and affixed to an underlying substrate and the collector side oriented upwards and affixed to a secondary substrate. The use of one flip-die IGBT and one die-up IGBT provides a smaller overall size of power module 220. It should be appreciated that in the various embodiments discussed herein either two flip-die IGBTs may be employed, such as in the manner of the embodiment of FIG. 13, or one die-up and one flip-die IGBT may be employed, such as in the manner of the embodiment of FIGS. 14A-14C.

Leadframes 234a-234i project outwardly from wall portion 231 and, as described below, project outwardly from wall portion 231 above, or elevated relative to, the plane of the substrate to which they are affixed. This provides spacing between the leadframes 234, relative from where they project out of wall portion 231, and the heat sink to which they are affixed, such as to a cooling plate or member 80 as discussed above. This spacing provides electrical isolation between the leadframes 234 relative to the heat sink, both in terms of an increased clearance or air gap between the leadframes 234 and the heat sink, as well as an increased creepage distance, that being the distance between two conductive parts along a surface, which distance in the illustrated embodiment is along wall portion 231. The illustrated embodiment provides a clearance distance of approximately 4.5 mm or more between the bottom of the portions of leadframes 234 extending out from wall portion 231 and the bottom surface of substrate 248, with the leadframes being approximately 0.8 to 1.2 mm thick.

The exposed portions of battery and phase terminals 234a, 234b, and 234c project substantially horizontally from wall portion 231. Signal leadframe pins 234d-234h and thermistor pins 234i also include a portion projecting horizontally outwardly from wall portion 231, but are subsequently bent to project upward for engagement with a gate driver board (not shown). With reference to FIG. 14C, in the illustrated embodiment each leadframe 234a-234i includes one or more affixed portions or segments 233 that are secured to a copper layer of substrate 248 by, for example, welding or sintering as discussed above. Each leadframe 234a-234i further includes a first or vertical extending portion or segment 235 extending generally upwardly from the affixed segments 233. Still further. In the illustrated embodiment, segments 233 and 235 are oriented by an approximately 90 degree bend. Still further, each leadframe 234a-234i further includes a second or horizontal extending portion or segment 237 connected with segments 235, with segments 237 being those that extend outwardly from wall portion 231. In the illustrated embodiment segments 235 and 237 are oriented by an approximately 90 degree bend. The visible portion of battery terminals 234a and 234b and phase terminal 234c extending out from cover 238 are defined by their respective horizontal extending segments 237. The gate drive leadframe pins 234d-234h and thermistor leadframe pins 234i further include an upright portion or segment 239 that extends vertically upward as shown from the respective segments 237 by an approximately 90 degree bend.

As understood from FIGS. 14A-14C, raised portion 225 of molded cover 238 encapsulates segments 233 and 235, as well as a portion of segments 237, with cover 238 providing strength and sealing to module 220, including to the connections of leadframes 234a-234i with substrate 248. Raised portion 225 of molded cover may thereby provide stability to the connections of leadframes 234a-234i with substrate 248 relative to the thermal cycles that module 220 will experience and which cause stress on the connection of the copper leadframes 234a-234i with substrate 248. In the illustrated embodiment of FIGS. 14A-14C leadframes 234a-234i are approximately 1.0 mm thick, with leadframes 234d-234i being approximately 1.0 to 1.3 mm wide.

Figure 15:
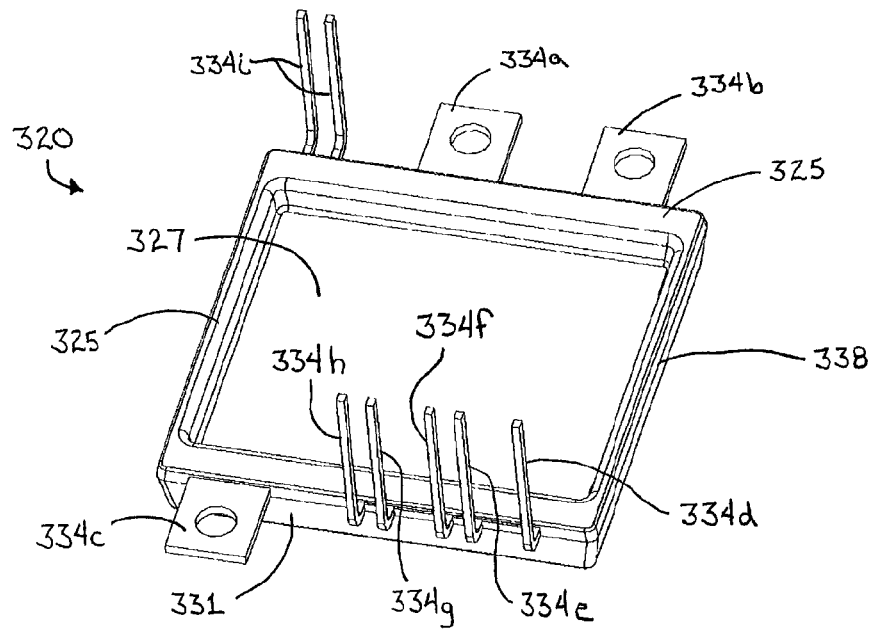
FIG. 15 is a perspective view of still another embodiment of a power module in accordance with the present invention.

Referring now to FIG. 15, an alternative power module 320 in accordance with the present invention is illustrated, where module 320 is similar to module 220 discussed above, with like elements being shown in FIG. 15 with 100 added to the corresponding reference numerals. Due to the similarities, not all of the corresponding features or aspects of power module 320 are discussed herein.

Power module 320 includes a cover 338 formed or molded about power module 320 to include a raised portion or edge 325 extending about the periphery of module 320. An inner recessed portion 327 covers the top surface of power module 320, with portion 327 being surrounded by edge 325 in the illustrated embodiment. Raised portion 325 further defines an upstanding wall portion 331 surrounding module 320, with wall portion 331 being generally vertically oriented in the illustrated embodiment. In contrast to modules 20, 120 and 220, cover 338 does not include an aperture on the top surface for exposing one or more upper substrates of power module, such as apertures 242 and 244 in recessed portion 227 of module 220. In like manner to bottom opening 243 of cover 238, however, cover 338 does include a bottom opening (not shown) that exposes the lower substrate for contact with a heat sink. As shown, leadframes 334a-334i extend outwardly from wall portion 331, with leadframes 334a-334i being of like construction to leadframes 234a-234i of power module 220, and raised portion 325 encapsulating portions of leadframes 334a-334i. Leadframes 334a-334i thus extend from wall portion 331 elevated relative to the portion of the substrate to which they are connected to promote electrical isolation.

Figure 16:
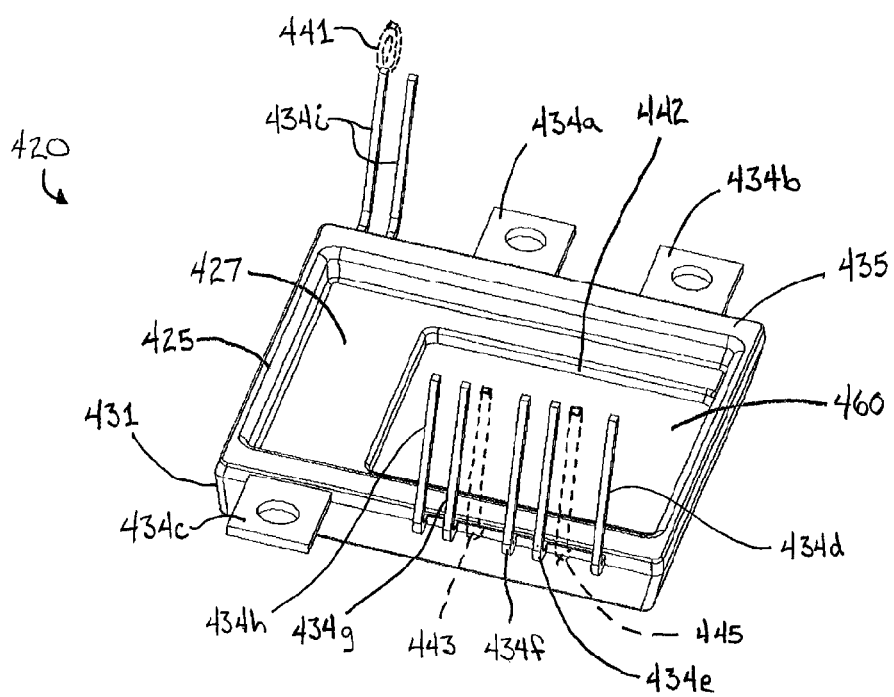
FIG. 16 is a perspective view of yet another embodiment of a power module in accordance with the present invention.

Referring now to FIG. 16, still another alternative power module 420 in accordance with the present invention is illustrated, with module 420 being similar to module 220 and having like elements shown in FIG. 16 with 200 added to the corresponding reference numerals. Due to the similarities, not all of the corresponding features or aspects of power module 420 are discussed herein.

Power module 420 includes a cover 438 formed or molded about power module 420 to include a raised portion or edge 425 extending about the periphery of module 420. An inner recessed portion 427 covers a portion of the top surface of power module 420, with portion 427 being surrounded by edge 425 in the illustrated embodiment. Raised portion 425 further defines an upstanding wall portion 431 surrounding module 420, with wall portion 431 being generally vertically oriented.

Figure 3:
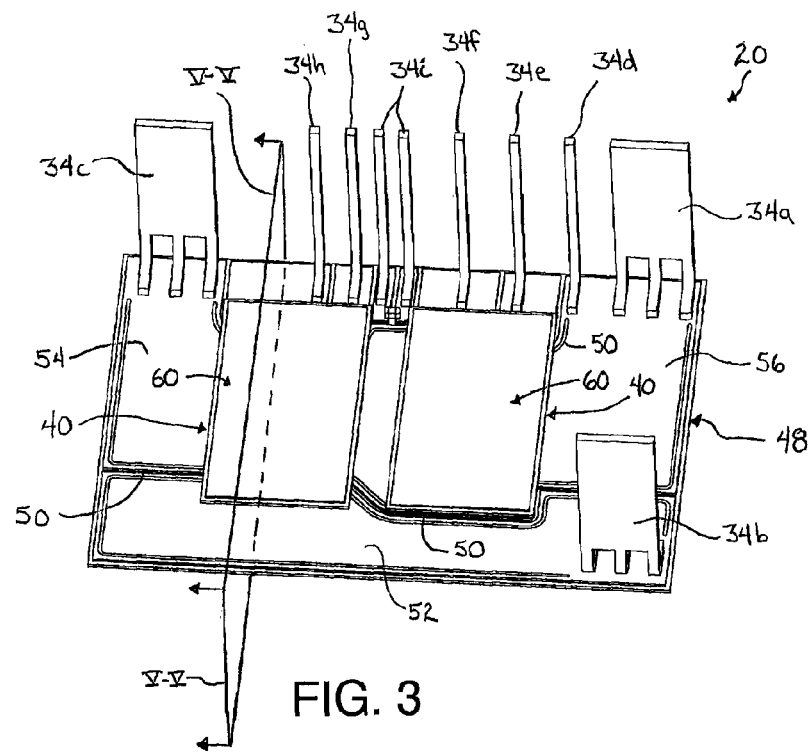
FIG. 3 is a perspective view of the power module of FIG. 2 shown with the cover removed, illustrating a pair of semiconducting switching circuits.

Cover 438 further includes a single aperture 442 exposing an upper substrate 460 of power module 420. Power module 420 includes two switching circuits, such as switching circuits 40 discussed above, but utilizes a single upper substrate 460 for such switching circuits. Instead of two separate substrates, such as separate substrates 60 as shown in FIG. 3, upper substrate 460 spans across the switching circuits. As should readily be appreciated, the inner surface of upper substrate 460 may include one or more troughs for electrically separating the switching circuits. For example with reference to FIG. 6, the inner copper surface 207 may be provided with troughs, in like manner to grooves 50, for providing electrical separation. In like manner to bottom opening 243 of cover 238, cover 438 also includes a bottom opening (not shown) that exposes the lower substrate for contact with a heat sink Use of a single aperture 420 and upper substrate 460 may be employed to improve cooling access. Additionally or alternatively, the use of a single upper substrate 460 may mitigate against co-planarity issues between separate substrates, such as relative to the separate substrates 60 of FIG. 3 which, due to their separate construction, may have decreased co-planarity relative to each other and with respect to the lower substrate 48. Thus, the use of a single upper substrate 460 may enhance the ability to cool module 420 by promoting contact with a heat sink applied to substrate 460.

It should be appreciated that the raised portions of the above discussed covers may be alternatively constructed within the scope of the present invention. For example, rather than a raised portion 225 surrounding the periphery of power module 220, an alternative cover may omit a raised portion on edges in which leadframes are not located, or omit the inclusion of a recessed portion while still enabling the various leadframes to protrude outwardly from a sidewall portion at an elevated orientation relative to the substrate to which they are connected to thereby promote electrical isolation.

As noted, the above discussed power modules may be connected with a gate driver board, where a gate driver board is positioned overtop of the top surface of a power module such that the upstanding leadframe pins, including the gate drive pins and thermistor pins, extend into the gate driver board. In the embodiment of FIGS. 7 and 8 the gate driver board would be positioned above second portions 82 of cooling unit 78 such that second portions 82 would be sandwiched between the gate driver board and the power module. The noted upstanding leadframe pins, such as pins 234d-234i of power module 220, connect with the gate driver board, such as by soldering. Alternatively, in any of the embodiments the upstanding leadframe pins may include a press fit end for connection with a gate driver board. A press fit end is demonstratively illustrated in FIG. 16 at 441, with end 441 being formed to include an elongated expanded hole portion that is press fit into a gate driver board. Leadframes having press fit ends may be supplied for construction of the power modules by Interplex Industries, of College Point, N.Y., U.S.A. This press fit connection may be utilized to provide a somewhat flexible, spring-like connection between the power module and gate driver board to promote accommodation of relative movement there between resulting from thermal expansion and contraction of the various components.

Low current signal leadframe pins may additionally be included to the power modules in any of the above noted embodiments, with such low current signal pins being used to monitor the current on the IGBT die formed between the substrates of each switching circuit device. With reference to FIG. 16, such low current signal pins are illustrated at 443 and 445, with leadframe pin 443 being associated with one switching circuit device 40 and leadframe pin 445 being associated with the other switching circuit device 40 within power module 420. Low current signal pins 443 and 445 are then connected with a gate driver board controller mounted to power module 420 in the above discussed manner to enable current sensing on the IGBT die.

It should be appreciated that various of the above discussed features of the power modules may alternatively be employed with the various embodiments. For example, any of the various substrate constructions of FIGS. 5, 6 and 9-12 may be employed in the power modules. Moreover, the battery and phase terminals of the various power modules may be provided either with or without a hole and captive nut, where such terminals omitting these structures are adapted for connection via welding. Additionally, although the above discussed power modules are disclosed as including a pair of switching circuit devices, it should be further appreciated that the power modules may be alternatively constructed to include one or more additional sets of switching circuit devices to provide increased power as required. For example, the above power modules may be alternatively constructed to include two switching circuit devices 40 in parallel on the high side and two switching circuit devices 40 in parallel on the low side, with each switching circuit device comprising an associated IGBT and diode as described above.

It will further be understood that the embodiments shown in the drawings and described above are merely for illustrative purposes, and are not intended to limit the scope of the invention which is defined by the claims which follow as interpreted under the principles of patent law including the doctrine of equivalents.

What is claimed is:

1. A power module for converting direct current to alternating current, said power module comprising:
    a semiconductor switching circuit device;
    a substrate onto which said switching circuit device is physically and electrically coupled without wirebonds;
    a plurality of leadframe terminals physically and electrically coupled to said substrate; and
    a cover at least partially disposed about said power module, said cover including an opening exposing a bottom side of said substrate and including a wall portion oriented generally orthogonally relative to said substrate with at least some of said leadframe terminals projecting outwardly from said wall portion;
    said leadframe terminals projecting outwardly from said wall portion including an affixed portion coupled to said substrate and an extending segment lying in a plane above said affixed portion, said extending segment projecting outwardly from said wall portion with said cover encapsulating said affixed portion whereby said extending segment is spaced from a plane defined by said bottom side of said substrate.

2. The power module of claim 1 wherein said leadframe terminals projecting outwardly from said wall portion further include a vertical segment, said vertical segment being positioned between said affixed portion and said extending segment with said vertical segment positioning said extending segment in a plane above said affixed portion.

3. The power module of claim 2 wherein said affixed portions are connected to said vertical segments by a first bend in said leadframe terminals, and wherein said extending segments are connected to said vertical segments by a second bend in said leadframe terminals.

4. The power module of claim 3 wherein said first bend forms an approximately right angle between said affixed portions and said vertical segments, and wherein said second bend forms an approximately right angle between said extending segments and said vertical segments.

5. The power module of claim 1 wherein said extending segments project generally horizontally from said wall portion relative to the plane defined by said bottom side of said substrate.

6. The power module of claim 1 further comprising at least one secondary substrate with said switching circuit device being physically and electrically coupled to said secondary substrate such that said switching circuit device is formed between said substrate and said secondary substrate.

7. The power module of claim 6 wherein said switching circuit device comprises a high side switching circuit device and a low side switching circuit device and includes a single secondary substrate disposed over both said high side switching circuit device and said low side switching circuit device.

8. The power module of claim 6 wherein said switching circuit device comprises a high side switching circuit device and a low side switching circuit device and includes a pair of secondary substrates, with one of said secondary substrates being physically and electrically coupled to said high side switching circuit device and the other of said secondary substrates being physically and electrically coupled to said low side switching circuit device.

9. The power module of claim 6 wherein said switching circuit device is coupled to said substrate and said secondary substrate by a soldered or a sintered connection.

10. The power module of claim 6 wherein said cover includes at least one cover aperture, said cover aperture exposing a top side of said secondary substrate.

11. The power module of claim 8 wherein said cover includes a pair of cover apertures, with one of said cover apertures exposing a top side of said secondary substrate of said high side switching circuit device and the other of said cover apertures exposing a top side of said secondary substrate of said low side switching circuit.

12. The power module of claim 1 wherein said leadframe terminals projecting outwardly from said wall portion include at least one of a battery terminal and a phase terminal, and wherein said leadframe terminals projecting outwardly from said wall portion further include an upright portion, said upright portion extending generally vertically upwards from said extending portions.

13. The power module of claim 1 wherein said switching circuit device includes either a plurality of insulated gate bipolar transistors and diodes or MOSFETs.

14. The power module of claim 1 wherein said substrate includes a ceramic layer having a top side and a bottom side, a first copper layer coupled to said top side of said ceramic layer, and a second copper layer coupled to said bottom side of said ceramic layer.

15. The power module of claim 1 wherein said substrate includes a copper layer, an aluminum oxide layer, and an aluminum plate, with said aluminum oxide layer being formed on said aluminum base plate and said copper layer being applied over said aluminum oxide layer.

16. The power module of claim 6 wherein said secondary substrate includes a ceramic layer having a top side and a bottom side, a first copper layer coupled to said top side of said ceramic layer, and a second copper layer coupled to said bottom side of said ceramic layer.

17. The power module of claim 6 wherein said secondary substrate includes a copper layer, an aluminum oxide layer, and an aluminum plate, with said aluminum oxide layer being formed on said aluminum base plate and said copper layer being applied over said aluminum oxide layer.

18. The power module of claim 1 wherein said cover comprises a molded cover and is at least partially disposed over a top side of said power module.

19. The power module of claim 18 wherein said cover includes a peripheral raised portion forming said wall portion, and wherein said affixed portions and part of said extending portions are encapsulated within said raised portion.

20. The power module of claim 19 wherein said cover includes said peripheral raised portion and said wall portion on at least two sides.

21. A power module for converting direct current to alternating current, said power module comprising:
a semiconductor switching circuit device;
an underlying substrate and at least one secondary substrate, said switching circuit device being physically and electrically coupled without wirebonds to said underlying substrate and said secondary substrate such that said switching circuit device is formed between said underlying substrate and said secondary substrate whereby said switching circuit device comprises at least one high side switching circuit device and at least one low side switching circuit device;
a plurality of leadframe terminals physically and electrically coupled to said underlying substrate; and
a cover at least partially disposed about a top side of said power module and including an opening exposing a bottom side of said substrate, said cover including an upstanding wall portion at least partially disposed about said opening with at least some of said leadframe terminals projecting outwardly from said wall portion;
said leadframe terminals projecting outwardly from said wall portion including a vertical segment encapsulated within said cover and an extending segment projecting outwardly from said wall portion, said vertical segment being connected to said extending segment and elevating said extending segment above said substrate whereby the portion of said extending segment projecting outwardly from said wall portion is vertically elevated from the connection of said leadframe terminals with said substrate.

22. The power module of claim 21 comprising either (a) a single secondary substrate disposed over both said high side switching circuit device and said low side switching circuit device, or (b) at least one pair of secondary substrates, with one of said pair of secondary substrates disposed over said high side switching circuit device and the other of said pair of secondary substrates disposed over said low side switching circuit device.

23. The power module of claim 21 wherein said cover includes at least one cover aperture, said cover aperture exposing a top side of said secondary substrate.

24. The power module of claim 21 wherein said leadframe terminals projecting outwardly from said wall portion include at least one of a battery terminal and a phase terminal, and wherein said leadframe terminals projecting outwardly from said wall portion further include an upright portion, said upright portion extending vertically upwards from said extending portions.

25. The power module of claim 21 wherein pairs of said high side switching circuit device and said low side switching circuit device are in parallel, and wherein each said high side switching circuit device and each said low side switching circuit device comprises an IGBT and a diode, with the respective IGBTs being arranged in series and the respective diodes being arranged in series.

26. The power module of claim 21 wherein at least one of said underlying substrate and said secondary substrate includes a ceramic layer having a top side and a bottom side, a first copper layer coupled to said top side of said ceramic layer, and a second copper layer coupled to said bottom side of said ceramic layer.

27. The power module of claim 21 wherein at least one of said underlying substrate and said secondary substrate includes a copper layer, an aluminum oxide layer, and an aluminum plate, with said aluminum oxide layer being formed on said aluminum base plate and said copper layer being applied over said aluminum oxide layer.

* * * * *